(12) United States Patent
Chen et al.

(10) Patent No.: US 11,406,006 B2
(45) Date of Patent: Aug. 2, 2022

(54) ELECTROMAGNETIC (EM) FIELD ROTATION FOR INTERCONNECTION BETWEEN CHIP AND CIRCUIT BOARD

(71) Applicant: QUALCOMM Incorporated, San Diego, CA (US)

(72) Inventors: Xiaoming Chen, San Diego, CA (US); Darryl Sheldon Jessie, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/122,820

(22) Filed: Dec. 15, 2020

(65) Prior Publication Data

US 2022/0192006 A1 Jun. 16, 2022

(51) Int. Cl.
*H05K 1/02* (2006.01)
*H05K 1/11* (2006.01)

(52) U.S. Cl.
CPC ........... *H05K 1/0222* (2013.01); *H05K 1/116* (2013.01); *H05K 2201/0367* (2013.01); *H05K 2201/09336* (2013.01); *H05K 2201/10734* (2013.01)

(58) Field of Classification Search
CPC .............................. H05K 1/0222; H05K 1/116
See application file for complete search history.

(56) References Cited

U.S. PATENT DOCUMENTS

| 9,202,783 | B1* | 12/2015 | Simpson | ........... H01L 23/49838 |
| 10,194,524 | B1* | 1/2019 | Park | ...................... H05K 1/116 |
| 2014/0209370 | A1* | 7/2014 | Minich | .............. H01R 13/6471 |
| | | | | 174/266 |
| 2018/0084637 | A1* | 3/2018 | Ueda | ...................... H01Q 1/12 |

* cited by examiner

*Primary Examiner* — Hoa C Nguyen
(74) *Attorney, Agent, or Firm* — Patterson+ Sheridan, L.L.P.

(57) ABSTRACT

Certain aspects of the present disclosure generally relate to a circuit board with ground vias offset from associated ground bumps. One example circuit board generally includes a first signal connection terminal configured to connect a signal line of the circuit board to an integrated circuit (IC); a ground plane having a first ground connection terminal disposed adjacent to the first signal connection terminal, the first ground connection terminal being configured to provide a ground connection between the ground plane and the IC; and a first ground via associated with and disposed adjacent to the first ground connection terminal and coupled to the ground plane, wherein, from an overhead view of the circuit board, the first ground via is located at a position that is offset from a first axis on which the first signal connection terminal and the first ground connection terminal are disposed.

20 Claims, 4 Drawing Sheets

ELECTROMAGNETIC (EM) FIELD ROTATION FOR INTERCONNECTION BETWEEN CHIP AND CIRCUIT BOARD

BACKGROUND

Field of the Disclosure

Certain aspects of the present disclosure generally relate to electronic components and, more particularly, to arrangement of vias in a circuit board.

Description of Related Art

A continued emphasis in electronic components and semiconductor technology is to create improved performance devices at competitive prices and/or with smaller sizes. This emphasis over the years has resulted in extreme miniaturization of devices, made possible by continued advances in processes and materials in combination with new and sophisticated device designs.

Power delivery networks (PDNs) may be used to provide power and reference voltages to one or more components on a circuit board or integrated circuit (IC) package. For example, a PDN may include interconnections for a power supply path. In some implementations, the PDN may be implemented in a circuit board for delivering power from power terminals to one or more components by way of a PDN channel.

Additionally, bypass capacitors may optionally be included as a means for reducing noise of the power supply and as a means for providing local storage of charge. The circuit board may also include various solder bumps and vias to facilitate electrical coupling of signals and reference potentials between various layers of the circuit board. A trace for the PDN channel may be routed between the vias of the circuit board.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description" one will understand how the features of this disclosure provide advantages that include improved arrangement of vias in a circuit board (e.g., for a wider power delivery network (PDN) channel).

Certain aspects of the present disclosure provide a circuit board. The circuit board generally includes a first signal connection terminal configured to connect a signal line of the circuit board to an integrated circuit (IC); a ground plane having a first ground connection terminal disposed adjacent to the first signal connection terminal, the first ground connection terminal being configured to provide a ground connection between the ground plane and the IC; and a first ground via associated with and disposed adjacent to the first ground connection terminal and coupled to the ground plane, wherein, from an overhead view of the circuit board, the first ground via is located at a position that is offset from a first axis on which the first signal connection terminal and the first ground connection terminal are disposed.

Other aspects of the present disclosure generally relate to a method for fabricating a circuit board. An exemplary fabrication method generally includes forming a first signal connection terminal configured to connect a signal line of the circuit board to an IC; forming a ground plane having a first ground connection terminal such that the first ground connection terminal is formed adjacent to the first signal connection terminal, the first ground connection terminal being configured to provide a ground connection between the ground plane and the IC; and forming a first ground via associated with the first ground connection terminal such that the first ground via is formed adjacent to the first ground connection terminal and coupled to the ground plane, wherein, from an overhead view of the circuit board, the first ground via is located at a position that is offset from a first axis on which the first signal connection terminal and the first ground connection terminal are disposed.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure relate to an arrangement of ground vias to facilitate efficient routing, such as routing of a trace through a power delivery network (PDN) channel. For example, a trace of the PDN channel may be formed such that the trace is between two vias (e.g., ground vias). In some cases, routing through the PDN channel may be implemented using a relatively narrow trace in order for the trace to fit between the two sets of vias. Certain aspects of the present disclosure are directed to an arrangement of the vias in a manner that facilitates formation of a wider trace for the PDN channel as compared to conventional implementations. By increasing the width of the trace for the PDN channel, power routing efficiency associated with the PDN channel may be improved.

Figure 1:
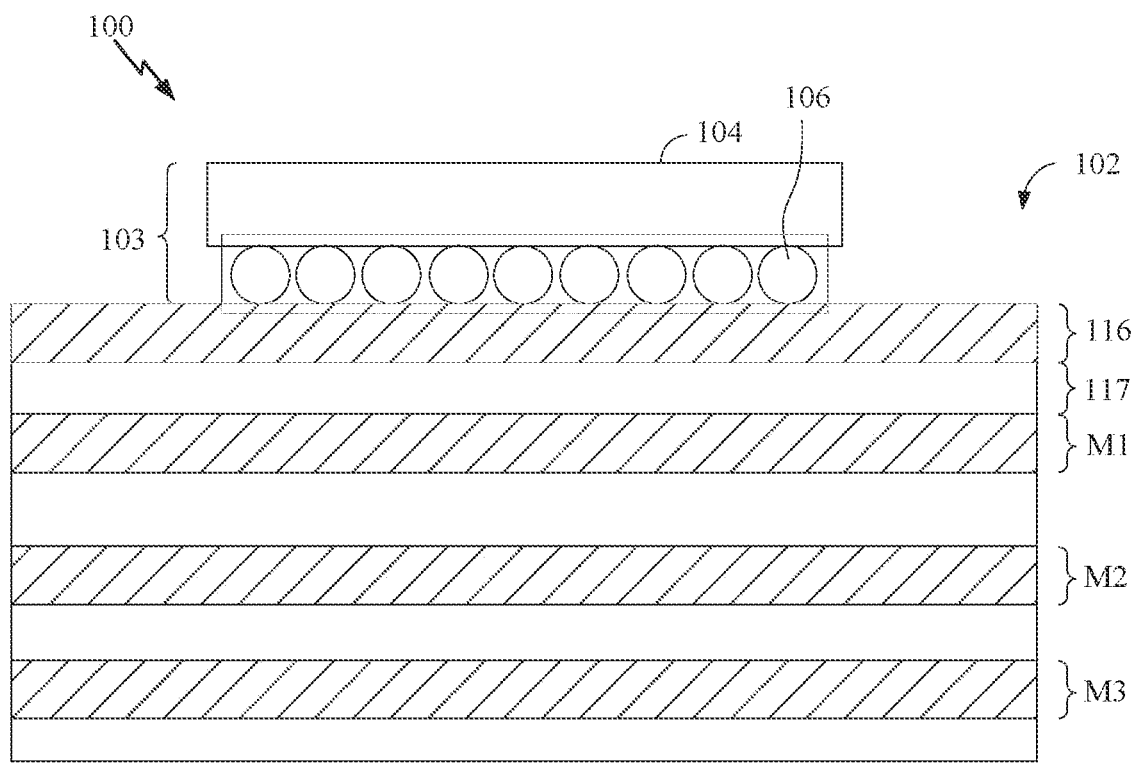
FIG. 1 is a cross-sectional view of an example circuit board on which an integrated circuit (IC) is disposed, in which certain aspects of the present disclosure may be practiced.

FIG. 1 illustrates an electronic device 100, in which certain aspects of the present disclosure may be practiced. The electronic device 100 includes a circuit board 102 (e.g., also referred to as a "printed circuit board (PCB)") on which an integrated circuit (IC) package assembly 103 may be disposed. In certain aspects, the package assembly 103 may include one or more IC dies which are encased in an encapsulation material 104 of the package assembly 103. As illustrated, the package assembly 103 may include solder bumps 106 (also referred to herein as "bumps" or "connection terminals"), which may be soldered on corresponding conductive pads of the circuit board 102. The solder bumps 106 may be coupled to one or more IC dies of the package assembly 103. The solder bumps 106 may be implemented as a ball grid array (BGA), for example. A BGA may be used to electrically couple the package assembly 103 to the circuit board 102, for example, using surface mount technology. The package assembly 103 may include the solder bumps 106 for electrical coupling to one or more of metal layers M1, M2, and/or M3 of the circuit board 102. As illustrated, the electronic device 100 may include a ground plane 116 disposed at an upper surface of the circuit board 102, above the metal layers M1, M2, and M3. The connection to the different layers may be facilitated by one or more vias (not shown). As shown in FIG. 1, the ground plane 116 may be the top metal layer of the circuit board 102. The metal layer M1 may be separated from the ground plane 116 by a dielectric region 117. One or more of the solder bumps 106 may be designated as ground bumps that are electrically coupled to the ground plane 116. The ground bumps provide electric coupling of the IC die(s) to the ground plane 116. One or more other bumps of the solder bumps 106 may be signal bumps used for electric coupling of digital and/or analog signals between the IC die(s) and the circuit board 102.

In certain aspects, the circuit board 102 may include a PDN channel through which power from a power supply may be routed to components, as described further herein. Furthermore, one or more capacitive elements (e.g., bypass capacitive elements) may be implemented in or attached to the circuit board to help reduce noise in the power supply. Certain aspects of the present disclosure are directed to an arrangement of vias of the circuit board to facilitate efficient routing, such as routing for the PDN channel. While some aspects of the present disclosure are described with respect to an arrangement of vias of a circuit board to facilitate understanding, the aspects described herein may be implemented for any electrical interface having vias used to provide electrical connectivity to an IC die, such as a package substrate or interposer on which the IC die may be disposed.

Figure 2:
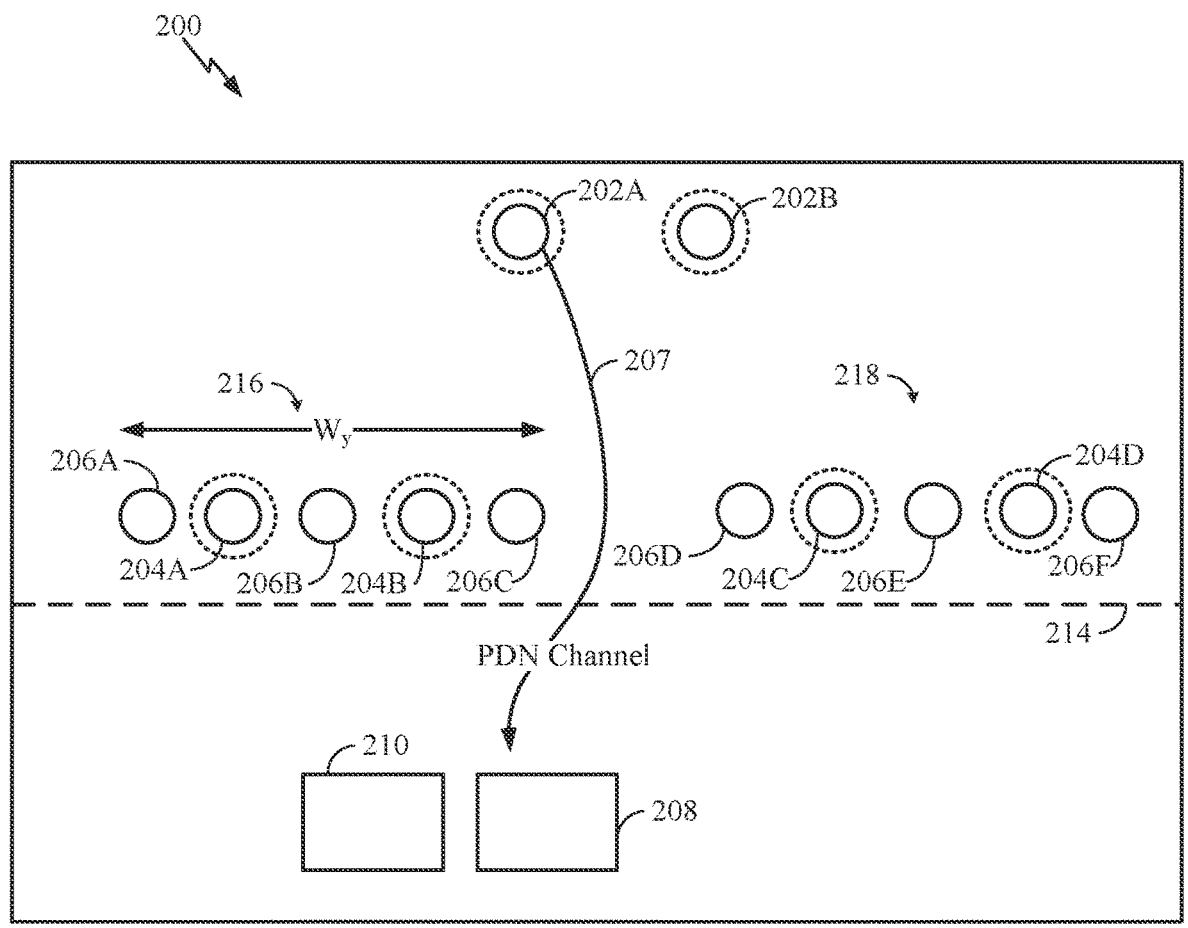
FIG. 2 illustrates an example power delivery network (PDN) in a circuit board.

FIG. 2 illustrates an example circuit board 200 (e.g., corresponding to circuit board 102) implemented with a PDN channel, in accordance with certain aspects of the present disclosure. As illustrated, the circuit board 200 includes signal bumps 204A, 204B, 204C, 204D (collectively referred to herein as "signal bumps 204") and ground bumps 206A, 206B, 206C, 206D, 206E, 206F (collectively referred to herein as "ground bumps 206"). While some examples provided herein are described with respect to conductive bumps (also referred to as conductive pads) for solder bumps to facilitate understanding, the aspects described herein may be applied to any suitable connection terminals configured to electrically couple a circuit board to an IC.

As shown, the circuit board 200 further includes capacitive elements 208, 210, as well as power bumps 202A, 202B (collectively referred to herein as "power bumps 202"). A first set of bumps 216 having signal bumps 204A, 204B and ground bumps 206A, 206B, 206C may be arranged in an alternating fashion to be in a ground-signal-ground (GSG) configuration (here in particular, a GSGSG configuration). Additionally, a second set of bumps 218 having signal bumps 204C, 204D and ground bumps 206D, 206E, 206F may also be arranged in an alternating fashion to be in a GSG configuration.

Each of the signal bumps 204 and the ground bumps 206 may be disposed beneath an IC die, where an edge of the die is shown by dotted line 214. A top layer of the circuit board 200 may be a ground plane (e.g., the ground plane 116 of FIG. 1) on which the ground bumps 206 are formed. Furthermore, each of the signal bumps 204 may be electrically isolated from the ground plane, as shown by the dashed circles around the signal bumps 204 representing a keep-out area.

In certain aspects, a PDN channel 207 may be configured to route power (e.g., via a trace) from the power bump 202A to the capacitive elements 208, 210 (e.g., bypass capacitors). In some cases, the PDN channel 207 may be located in a lower metal layer (e.g., a metal layer below the ground plane) of the circuit board 200 (e.g., the metal layer M1 of the circuit board 102 of FIG. 1). For example, the lower metal layer on which the PDN channel 207 is located may be connected to the power bumps 202 by one or more vias (not shown) extending below the top layer into the page for FIG. 2. The power bumps 202 may be formed to be electrically isolated from the ground plane on the circuit board 200, as shown by the dashed circles (e.g., keep-out areas) around the power bumps 202.

Typically, a ground via may be disposed directly below each of the ground bumps for coupling the ground bumps to one or more layers of the circuit board 200. Thus, for the first set of bumps 216, a width from a ground via (not shown) below the ground bump 206A to a via below the ground bump 206C may be $W_y$. The larger the width $W_y$, the less room there may be in the PDN channel 207 for routing between the power bump 202A and the capacitive elements 208, 210. Thus, a power connection in the PDN channel 207 may be implemented with a relatively narrow trace, resulting in larger inductance and resistance and degraded PDN performance.

Certain aspects of the present disclosure provide an arrangement of vias that allows implementation of a wider trace in the PDN channel as compared to conventional implementations, decreasing the inductance and resistance of the trace in the PDN channel and improving PDN performance.

Figure 3:
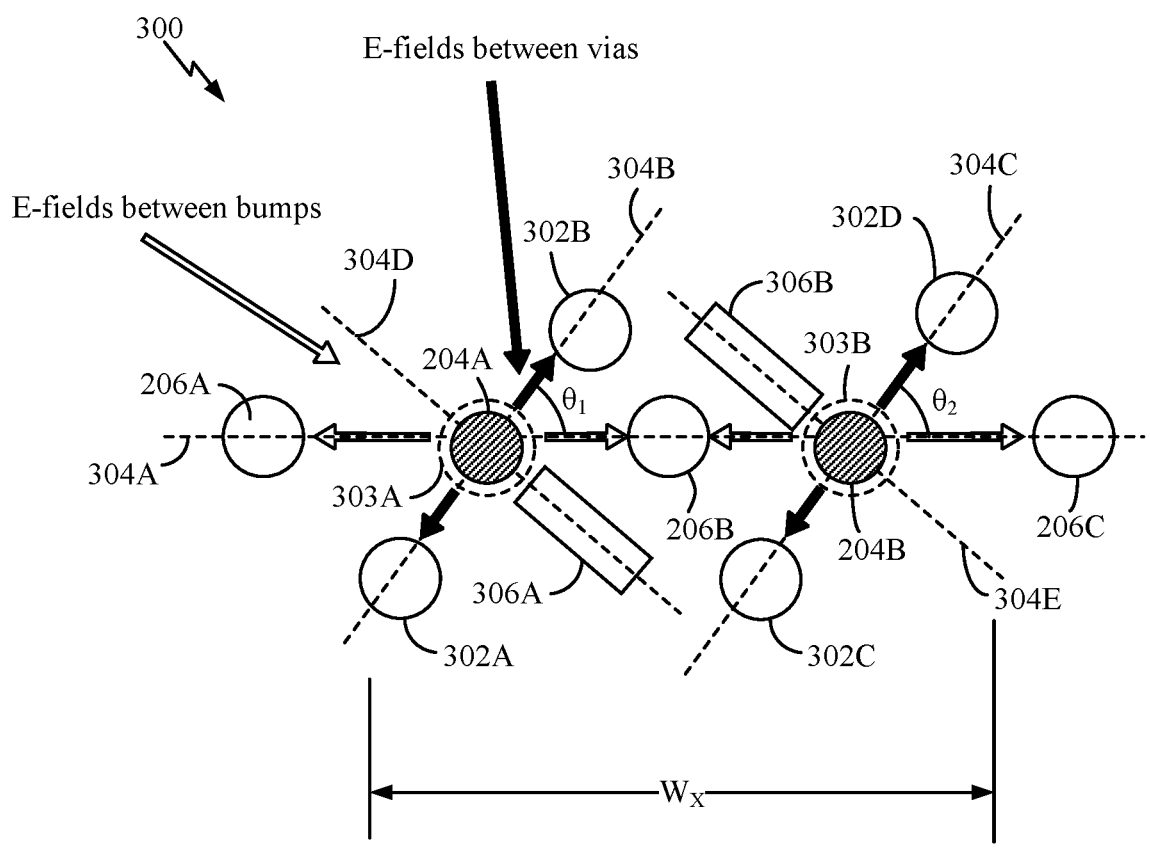
FIG. 3 is an overhead view of an example arrangement of solder bumps and vias, according to certain aspects of the present disclosure.

FIG. 3 is an overhead view of an example arrangement of bumps and vias of a circuit board 300, according to certain aspects of the present disclosure. The circuit board 300 may have a similar structure to and include similar components as the circuit board 200 of FIG. 2. As shown in FIG. 3, the circuit board 300 may include ground vias 302A, 302B, 302C, 302D (collectively referred to herein as "ground vias 302"), and signal vias 303A, 303B (collectively referred to herein as "signal vias 303"). Both the ground and signal vias 302, 303 may extend into the page for FIG. 3, from the top layer or just beneath the top layer down to lower layers of the circuit board 300. Each of the signal vias 303A, 303B facilitates electrical coupling of a respective one of the signal bumps 204A, 204B to a respective one of the transmission lines 306A, 306B. The signal vias 303 may be located directly beneath the signal bumps 204.

As illustrated, the ground bumps 206A, 206B, 206C, and the signal bumps 204A, 204B may be arranged on an axis 304A. As described herein, a ground via associated with each of the ground bumps 206A, 206B, 206C may typically be formed directly below a respective one of the ground bumps 206A, 206B, 206C. In other words, the ground vias associated with the ground bumps 206A, 206B, 206C may typically be implemented on the axis 304A because the respective ground bumps 206A, 206B, 206C are located on the axis 304A. In certain aspects of the present disclosure, however, the ground vias 302 associated with the ground bumps 206A, 206B, 206C may be offset from the axis 304A in order to reduce the width of the ground via arrangement. In other words, the width Wx from the ground via 302A to the ground via 302D may be reduced, as compared to conventional implementations where a ground via is formed directly below each of the ground bumps 206A, 206B, 206C.

For instance, ground vias 302A, 302B (or more specifically, cross-sections of ground vias 302A, 302B) may be arranged to be on an axis 304B, which is at an angle with respect to the axis 304A. In other words, the locations of the ground vias 302A, 302B are offset from the axis 304A. As illustrated, the electric field between the signal bumps and the ground bumps is along the axis 304A, whereas the electric field between the signal via 303A and the ground via 302A (or 302B) is along the axis 304B. Similarly, ground vias 302C, 302D (or more specifically, cross-sections of ground vias 302C, 302D) may be arranged to be on an axis 304C (also at an angle with respect to the axis 304A) such that the locations of the ground vias 302C, 302D are offset from the axis 304A. As illustrated, the electric field between the signal via 303B and the ground via 302C (or 302D) is along the axis 304C.

In certain aspects, an angle $\theta_1$ between axis 304A and axis 304B may be greater than 0 degrees and less than 90 degrees. In certain aspects, an angle $\theta_2$ between the axis 304C and axis 304A may be greater than 0 degrees and less than 90 degrees. The angle $\theta_1$ may be equal to angle $\theta_2$ in certain aspects, but may be different in other aspects.

Moreover, transmission line 306A coupled to the signal via 303A may be formed along an axis 304D, which may be perpendicular to the axis 304B. In other words, the transmission line 306A may be formed along the axis 304D such that the electric field between the signal via 303A and the ground via 302A (or the ground via 302B) is perpendicular to the axis 304D along which the transmission line 306A is formed. For other aspects, the axis 304D may be at an angle that is more or less than 90 degrees with respect to the axis 304B. Similarly, transmission line 306B coupled to the signal via 303B may be formed along an axis 304E, which may be perpendicular to the axis 304C. In other words, the transmission line 306B may be formed along the axis 304E such that the electric field between the signal via 303B and the ground via 302C (or ground via 302D) is perpendicular to the axis 304E along which the transmission line 306B is formed. For other aspects, the axis 304E may be at an angle that is more or less than 90 degrees with respect to the axis 304C.

Figure 4:
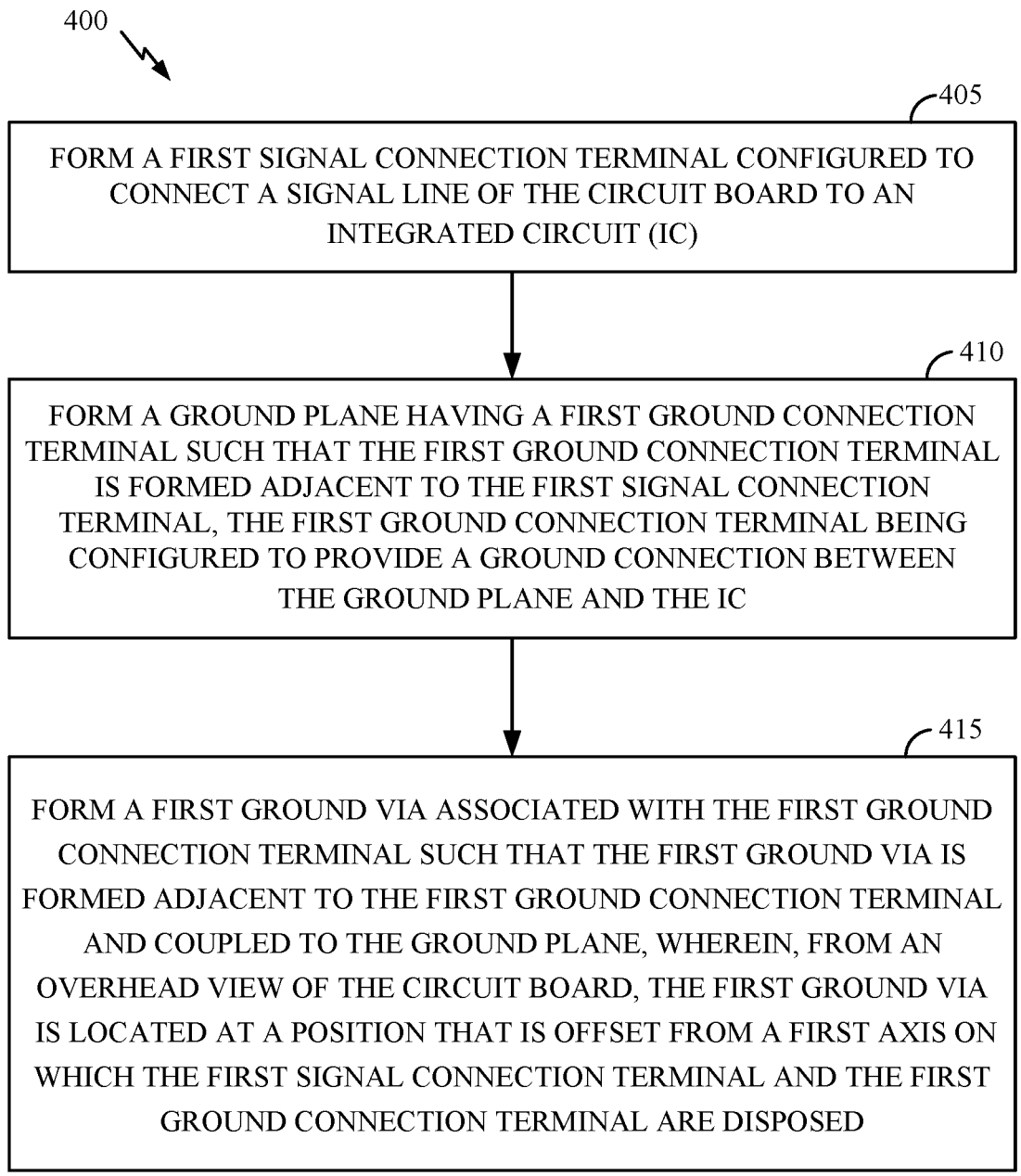
FIG. 4 is a block diagram of example operations for fabricating a circuit board, in accordance with certain aspects of the present disclosure.

FIG. 4 is a block diagram of example operations 400 for fabricating a circuit board (e.g., the circuit board 300 of FIG. 3), in accordance with certain aspects of the present disclosure. The operations 400 may be performed, for example, by a fabrication facility.

The operations 400 begin, at block 405, with the fabrication facility forming a first signal connection terminal (e.g., the signal bump 204A) configured to connect a signal line (e.g., transmission line 306A) of the circuit board to an IC (e.g., the IC package assembly). At block 410, the fabrication facility may form a ground plane (e.g., the ground plane 116) having a first ground connection terminal (e.g., the ground bump 206A) such that the first ground connection terminal is formed adjacent to the first signal connection terminal. The first ground connection terminal is configured to provide a ground connection between the ground plane and the IC.

At block 415, the fabrication facility may form a first ground via (e.g., the ground via 302A) associated with the first ground connection terminal such that the first ground via is adjacent to the first ground connection terminal and coupled to the ground plane. In some aspects, from an overhead view of the circuit board, the first ground via is located at a position that is offset from a first axis (e.g., the axis 304A) on which the first signal connection terminal and the first ground connection terminal are formed.

In certain aspects, the facility may form a metal layer (e.g., the metal layer M1) of the circuit board such that the metal layer is adjacent to and below the ground plane, and the facility may form a dielectric region (e.g., the dielectric region 117 between the metal layer M1 and the ground plane 116) such that the dielectric region is between the first ground connection terminal and the metal layer. In other words, there may not be a ground via directly below the first ground connection terminal.

In certain aspects, from the overhead view, the first ground via and the first signal connection terminal are on a second axis (e.g., the axis 304B), and an angle (e.g., the angle $\theta_1$) between the first axis and the second axis is less than 90 degrees (and greater than 0 degrees). In this case, from the overhead view, a vertex of the angle is at a position of the first signal connection terminal.

In some cases, the facility may form a second signal connection terminal (e.g., the signal bump 204B) configured to connect another signal line (e.g., transmission line 306B) of the circuit board to the IC, where forming the ground plane includes forming a second ground connection terminal (e.g., the ground bump 206B) such that the second ground connection terminal is formed adjacent to the second signal connection terminal, the second ground connection terminal being configured to provide another ground connection between the ground plane and the IC. The facility may also form a second ground via (e.g., the ground via 302C) such that the second ground via is coupled to the ground plane, where, from the overhead view of the circuit board, the second ground via is located at a position that is offset from the first axis on which the second signal connection terminal and the second ground connection terminal are formed. In this case, the second ground via and the second signal connection terminal may be on a third axis (e.g., the axis 304C), where an angle (e.g., the angle $\theta_2$) between the first axis and the third axis is less than 90 degrees, and where a vertex of the angle between the first axis and the third axis is at a position of the second signal connection terminal.

In certain aspects, each of the first signal connection terminal and the first ground connection terminal includes a solder bump terminal.

In certain aspects, the facility may form a power connection trace in a layer (e.g., the metal layer M1) of the circuit board, where at least a portion of the first ground via is between the layer of the circuit board and the ground plane. In this case, the facility may also form a power connection terminal (e.g., the power bump 202A) configured to connect a power line of the circuit board to the IC, where the power connection trace is configured to electrically couple the power connection terminal to a capacitive element (e.g., the capacitive element 208), which may be a bypass capacitor.

In certain aspects, the facility may form a signal via (e.g., the signal via 303A) below the first signal connection terminal. From the overhead view, (a cross-section of) the first ground via and the first signal connection terminal may be on a second axis (e.g., axis 304B). In this case, the facility may also form a transmission line (e.g., the transmission line 306A) coupled to the signal via, and the transmission line may be disposed along a third axis (e.g., axis 304D), which may be perpendicular to the second axis.

In certain aspects, the facility may form a second ground via (e.g., the ground via 302B) coupled to the ground plane, where, from the overhead view of the circuit board, the second ground via is located at a position that is offset from the first axis on which the first signal connection terminal and the first ground connection terminal are formed. In this case, from the overhead view, the second ground via and the first signal connection terminal are on a second axis (e.g., the axis 304B), where an angle (e.g., the angle $\theta_1$) between the first axis and the second axis is less than 90 degrees. Furthermore, from the overhead view, the first ground via and the first signal connection terminal are on a third axis (e.g., the axis 304B), where an angle (e.g., the angle $\theta_1$) between the first axis and the third axis is less than 90 degrees. In some aspects, the second axis and the third axis are the same axis.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

It is to be understood that the claims are not limited to the precise configuration and components illustrated above. Various modifications, changes and variations may be made in the arrangement, operation and details of the methods and apparatus described above without departing from the scope of the claims.

The invention claimed is:

1. A circuit board comprising:
   a first signal connection terminal configured to connect a signal line of the circuit board to an integrated circuit (IC);
   a ground plane having a first ground connection terminal disposed adjacent to the first signal connection terminal, the first ground connection terminal being configured to provide a ground connection between the ground plane and the IC; and
   a first ground via associated with and disposed adjacent to the first ground connection terminal and coupled to the ground plane, wherein, from an overhead view of the circuit board, the first ground via is located at a position that is offset from a first axis on which the first signal connection terminal and the first ground connection terminal are disposed.

2. The circuit board of claim 1, further comprising:
   a metal layer disposed adjacent to and below the ground plane; and
   a dielectric region disposed between the first ground connection terminal and the metal layer.

3. The circuit board of claim 1, wherein, from the overhead view, the first ground via and the first signal connection terminal are on a second axis, and wherein an angle between the first axis and the second axis is less than 90 degrees.

4. The circuit board of claim 3, wherein, from the overhead view, a vertex of the angle is at a position of the first signal connection terminal.

5. The circuit board of claim 4, further comprising a second signal connection terminal configured to connect another signal line of the circuit board to the IC, wherein the ground plane comprises a second ground connection terminal disposed adjacent to the second signal connection terminal, the second ground connection terminal being configured to provide another ground connection between the ground plane and the IC; and
    a second ground via coupled to the ground plane, wherein, from the overhead view of the circuit board, the second ground via is located at a position that is offset from the first axis on which the second signal connection terminal and the second ground connection terminal are disposed.

6. The circuit board of claim 5, wherein from the overhead view:
    the second ground via and the second signal connection terminal are on a third axis;
    an angle between the first axis and the third axis is less than 90 degrees; and
    a vertex of the angle between the first axis and the third axis is at a position of the second signal connection terminal.

7. The circuit board of claim 1, wherein each of the first signal connection terminal and the first ground connection terminal comprises a solder bump terminal.

8. The circuit board of claim 1, further comprising a power connection trace disposed in a layer of the circuit board, at least a portion of the first ground via being between the layer of the circuit board and the ground plane.

9. The circuit board of claim 8, further comprising a power connection terminal configured to connect a power line of the circuit board to the IC, wherein the power connection trace is configured to electrically couple the power connection terminal to a capacitive element.

10. The circuit board of claim 9, wherein the capacitive element comprises a bypass capacitor.

11. The circuit board of claim 1, further comprising a signal via disposed below the first signal connection terminal.

12. The circuit board of claim 11, wherein:
    from the overhead view, the first ground via and the first signal connection terminal are on a second axis;
    the circuit board further comprises a transmission line coupled to the signal via; and
    the transmission line is disposed along a third axis that is perpendicular to the second axis.

13. The circuit board of claim 1, further comprising a second ground via coupled to the ground plane, wherein, from the overhead view of the circuit board, the second ground via is located at a position that is offset from the first axis on which the first signal connection terminal and the first ground connection terminal are disposed.

14. The circuit board of claim 13, wherein, from the overhead view, the second ground via and the first signal connection terminal are on a second axis, and wherein an angle between the first axis and the second axis is less than 90 degrees.

15. The circuit board of claim 14, wherein, from the overhead view, the first ground via and the first signal connection terminal are on a third axis, and wherein an angle between the first axis and the third axis is less than 90 degrees.

16. The circuit board of claim 15, wherein the second axis and the third axis are the same axis.

17. A method of fabricating a circuit board, comprising:
    forming a first signal connection terminal configured to connect a signal line of the circuit board to an integrated circuit (IC);
    forming a ground plane having a first ground connection terminal such that the first ground connection terminal is formed adjacent to the first signal connection terminal, the first ground connection terminal being configured to provide a ground connection between the ground plane and the IC; and
    forming a first ground via associated with the first ground connection terminal such that the first ground via is formed adjacent to the first ground connection terminal and coupled to the ground plane, wherein, from an overhead view of the circuit board, the first ground via is located at a position that is offset from a first axis on which the first signal connection terminal and the first ground connection terminal are disposed.

18. The method of claim 17, wherein, from the overhead view, the first ground via and the first signal connection terminal are on a second axis, and wherein an angle between the first axis and the second axis is less than 90 degrees.

19. The method of claim 18, wherein, from the overhead view, a vertex of the angle is at a position of the first signal connection terminal.

20. The method of claim 19, further comprising
    forming a second signal connection terminal configured to connect another signal line of the circuit board to the IC, wherein forming the ground plane comprises forming the ground plane having a second ground connection terminal such that the second ground connection terminal is formed adjacent to the second signal connection terminal, the second ground connection terminal being configured to provide another ground connection between the ground plane and the IC; and
    forming a second ground via such that the second ground via is coupled to the ground plane, wherein, from the overhead view of the circuit board, the second ground via is located at a position that is offset from the first axis on which the second signal connection terminal and the second ground connection terminal are formed.

\* \* \* \* \*